(12) United States Patent
Ouchi et al.

(10) Patent No.: US 6,320,691 B1
(45) Date of Patent: Nov. 20, 2001

(54) ELECTRODE CONNECTION METHOD

(75) Inventors: Toshimichi Ouchi, Yokohama; Riichi Saito, Fujisawa; Masanori Takahashi, Chigasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/584,483

(22) Filed: Jun. 1, 2000

Related U.S. Application Data (62) Division of application No. 08/826,689, filed on Apr. 7, 1997, now Pat. No. 6,089,442.

(30) Foreign Application Priority Data

Apr. 10, 1996 (JP) .................................................. 8-088625
Apr. 26, 1996 (JP) .................................................. 8-108168

(51) Int. Cl.$^7$ .............................. G02F 1/03; G02F 1/07; G02B 26/00
(52) U.S. Cl. .................... 359/237; 359/242; 359/245; 359/254; 359/295
(58) Field of Search ..................... 228/180.1, 118, 228/215, 222, 46, 6.2; 361/748, 795, 792; 428/901, 209, 210; 359/237, 295, 259, 242

(56) References Cited

U.S. PATENT DOCUMENTS

| | | | |
|---|---|---|---|
| 3,648,354 | * 3/1972 | Mashino et al. | 29/470.1 |
| 3,962,714 | * 6/1976 | King | 357/19 |
| 4,569,574 | * 2/1986 | Masaki et al. | 350/334 |
| 4,634,227 | * 1/1987 | Nishimura et al. | 350/334 |
| 4,648,686 | * 3/1987 | Segawa | 350/96.13 |
| 4,703,559 | * 11/1987 | Ehrfeld et al. | 29/854 |
| 4,802,744 | * 2/1989 | Shindo et al. | 350/339 F |
| 4,950,527 | * 8/1990 | Yamada | 428/192 |
| 4,964,700 | * 10/1990 | Takabayashi | 350/336 |
| 5,074,648 | * 12/1991 | Warszawski | 359/265 |
| 5,288,006 | * 2/1994 | Otsuka et al. | 228/111 |
| 5,398,863 | * 3/1995 | Grube et al. | 228/106 |
| 5,489,749 | * 2/1996 | DiStefano et al. | 174/261 |
| 5,501,004 | * 3/1996 | Onitsuka | 29/827 |
| 5,506,919 | * 4/1996 | Roberts | 385/1 |
| 5,523,920 | * 6/1996 | Machuga et al. | 361/767 |
| 5,653,017 | * 8/1997 | Cathey et al. | 29/830 |
| 5,698,068 | * 12/1997 | Ichikawa et al. | 156/581 |
| 5,743,459 | * 4/1998 | Urushima | 228/180.21 |
| 5,943,217 | * 8/1999 | Hashimoto | 361/777 |
| 6,023,075 | * 2/2000 | Yamazaki | 257/72 |
| 6,094,294 | * 7/2000 | Yokoyama et al. | 359/290 |
| 6,104,462 | * 8/2000 | Kurosaki et al. | 349/138 |
| 6,195,139 | * 2/2001 | Yamazaki et al. | 349/43 |

FOREIGN PATENT DOCUMENTS

359129831A * 7/1984 (JP) .
410051097A * 2/1998 (JP) .

* cited by examiner

Primary Examiner—Tom Dunn
Assistant Examiner—Kiley Stoner
(74) Attorney, Agent, or Firm—Fitzpatrick, Cella, Harper & Scinto (57) ABSTRACT

A method of connecting first electrodes formed on a first substrate to second electrodes formed on a second substrate and partially coated with a resist pattern so as to substantially expose an opening thereof at a surface of the second electrodes includes (a) coating the second electrodes with a solder at the opening of the resist pattern, (b) aligning the first electrodes with the second electrodes, and (c) electrically connecting the first electrodes to the second electrodes through the solder by heat-pressing the first and second electrodes with a heat-pressure bonding head including a tip face having a width smaller than a width of the opening of the resist pattern so as to heat-press the first and second electrodes at an entire region of the tip face of the heat-pressure bonding head. The method is effective in performing a good electrical connection between electrodes through a solder irrespective of an amount of the solder.

7 Claims, 8 Drawing Sheets

ELECTRODE CONNECTION METHOD

This application is a division of application Ser. No. 08/826,689 filed Apr. 7, 1997 now U.S. Pat. No. 6,089,442.

FIELD OF THE INVENTION AND RELATED ART

The present invention relates to a method of connecting electrodes of two substrates to each other with a solder, specifically a method of connecting electrodes of a flexible film substrate loaded with a semiconductor chip to connection electrodes of a peripheral circuit board. Particularly, the present invention relates to a method of connecting input electrodes of a flexible circuit board loaded with a semiconductor chip for driving an optical modulation device, such as a liquid crystal device (or panel), to connection electrodes of a peripheral circuit board for supplying (inputting) a driving power and control signals to the semiconductor chip.

Hereinbelow, a method of connecting electrodes formed on two substrates to each other will be described while taking a packaging of a driver IC (integrated circuit) for an optical modulation device as an example.

In a packaging method of a driver IC for optical modulation apparatus, e.g., display apparatus including flat display devices having display electrodes arranged in the form of a matrix, such as EL display panels and liquid crystal display panels of the simple matrix-type and the active matrix-type, there has been generally practiced a method wherein transparent electrodes formed at the surface of a substrate of the display (optical modulation) panel are connected to connection electrodes formed at a periphery of the substrate; the connection electrodes are connected to output electrodes of a tape carrier package or tape carrier package structure (TCP) loaded with a driver semiconductor chip (e.g., driver IC) via an anisotropic conductive film (adhesive) by a thermocompression bonding method, such as a tape automated bonding (TAB) method; and input electrodes of the TCP are connected to connection electrodes of a print circuit board (PCB, herein after sometimes referred to a "PCB board") as a peripheral circuit board for supplying a drive power and control signal to the driver IC by using solder.

Figure 6:
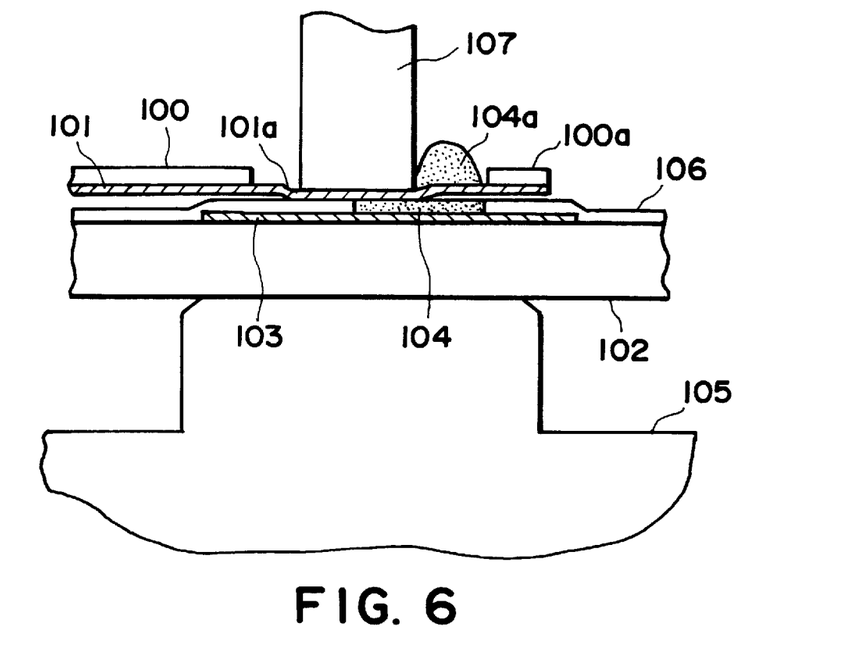
FIGS. 6 and 7 are respectively a schematic sectional view for illustrating an embodiment of a conventional method of connecting input electrodes of a TCP to electrodes of a PCB board by heat-pressure bonding.

FIG. 6 shows a schematic sectional view of an embodiment of a connection structure of a TCP and a PCB board. The TCP includes a flexible film substrate 100, a plurality of input electrodes 101 and a plurality of output electrodes (not shown) respectively formed on the flexible film substrate 100, and a semiconductor device (driver IC) (not shown) mounted on the substrate and connected to the input electrodes 101 and the output electrodes, respectively.

Referring to FIG. 6, the input electrodes 101 of the flexible film substrate 100 are connected via solder 104 to associated connection electrodes 103 of a PCB substrate 102, respectively, at their lead portions 101a disposed in an exposed state at a spacing between the inner portion 100 of the substrate and an end portion 100a of the substrate. On the other hand, the output electrodes of the flexible film substrate 100 are bonded to a (glass) substrate (of the display panel) and fixed thereon at a prescribed position by, e.g., an anisotropic conductive film (not shown).

Soldering between the lead electrode portions 101 and the connection electrodes 103 may generally be performed in the following manner.

Referring to FIG. 6 again, the connection electrodes 103 of the PCB board 102 disposed on a stage 105 and having thereon a solder resist 106 is pre-coated with a solder 104 at their exposed regions (not covered with the solder resist 106) by, e.g., a plating method, a super-solder method or a super-jufit method. Then, the connection electrodes 103 are registered or positioned in alignment with the lead portions 101a of the input electrodes 101, followed by thermocompression (heat-pressure bonding) with the solder 104 by using a thermocompression (heat-pressure bonding) head 107 having a width substantially equal to or larger than a length of the exposed (opening) region (where the solder 104 is pre-coated) of the solder resist 106 while pressing the lead portions 101a against the connection electrodes 103 at a position in the neighborhood of a boundary between the solder resist 106 and the solder 104.

In this case, however, if the solder 104 is used excessively for pre-coating, an excessive solder 104a is concentrated or accumulated at one terminal region where the solder 104 can escape therefrom, of the lead portions 101a closer to the end portion 100a of the flexible film substrate 100 as shown in FIG. 6, thus resulting in a solder bridge between adjacent lead electrode portions at the terminal region. As a result, unnecessary electrical conduction between the adjacent lead electrode portions is liable to be caused to occur.

Figure 7:
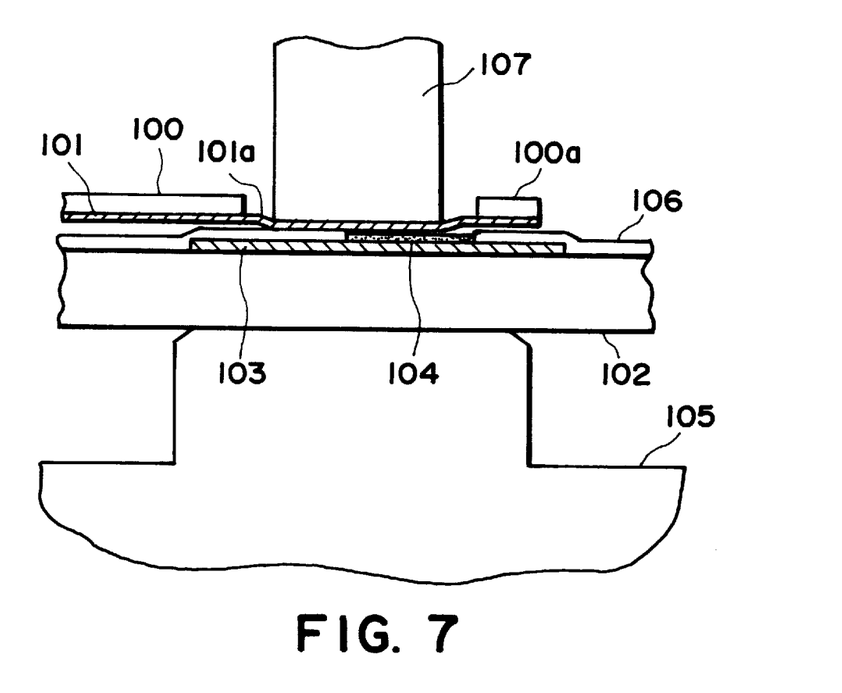

Further, as shown in FIG. 7, in case where an amount of the solder 104 for pre-coating is small, the lead electrode portions 101a of the flexible film substrate 100 are not made contact with the solder 104 since it is difficult to heat-press the lead electrode portions 101a against the associated connection electrodes 103 through such a small amount of the solder 104 having a height lower than the height (thickness) of the solder resist 106 (formed on the connection electrodes 103), thus failing to effect an electrical connection between the lead electrodes 101 and the connection electrodes 103.

For this reason, the pre-coating amount of the solder 104 is required to be controlled so that the resultant solder layer has a thickness (height) larger than the thickness of the solder resist 106 and the solder 104 does not cause a bridge between adjacent lead electrode portions 101a and/or between adjacent connection electrodes 103.

However, in the case of the above-described heat-pressure bonding method as shown in FIGS. 6 and 7, it is technically difficult to appropriately control an amount of pre-coating solder. Further, the thickness of the solder resist layer 5 per se is not generally uniform.

SUMMARY OF THE INVENTION

An principal object of the present invention is to provide a method of connecting electrodes of one substrate to those of the other substrate through a solder, capable of effecting a good electrical connection irrespective of an amount of pre-coated solder placed on one of the substrate.

According to the present invention, there is provided a method of connecting first electrodes formed on a first substrate to second electrodes formed on a second substrate and partially coated with a resist pattern so as to substantially expose an opening thereof at a surface of the second electrodes, said method comprising the steps of:

(a) coating the second electrodes with a solder at the opening of the resist pattern, (b) aligning the first electrodes with the second electrodes, and (c) electrically connecting the first electrodes to the second electrodes through the solder by heat-pressing the first and second electrodes with a heat-pressure bonding head including a tip face (pressing or contacting face) having a width smaller than a width of the opening of the resist pattern so as to heat-press the first and second electrodes at an entire region of the tip face of the heat-pressure bonding head.

According to the present invention, there is also provided a method of connecting first electrodes formed on a first substrate to second electrodes formed on a second substrate, said method comprising the steps of:

(a) aligning the first electrodes with the second electrodes, and (b) electrically connecting the first electrodes to the second electrodes by heat-pressing the first and second electrodes while supplying a cooling gas to at least one of the first and second substrates.

According to the present invention, there is further provided a method for producing an optical modulation apparatus which includes: an optical modulation panel, a tape carrier package structure comprising a flexible substrate, a semiconductor device for driving the panel mounted on the flexible substrate, and input electrodes and output electrodes for the semiconductor device; and a circuit board provided with connection electrodes partially coated with resist pattern so as to leave an opening thereof and supplying a power and control signals to the semiconductor device; said process comprising the steps of:

(a) electrically connecting electrode terminals of the optical modulation panel to the output electrodes of the tape carrier package structure, (b) coating the connection electrodes with a solder at the opening of the resist pattern, (c) aligning the input electrodes of the tape carrier package structure with the connection electrodes of the circuit board, and (d) electrically connecting the input electrodes to the connection electrodes through the solder by heat-pressing the input and connection electrodes with a heat-pressure bonding head including a tip face having a width smaller than a width of the opening of the resist pattern so as to heat-press the input and connection electrodes at an entire region of the tip face of the heat-pressure bonding head.

According to the present invention, there is still further provided a method for producing an optical modulation apparatus which includes: an optical modulation panel; a tape carrier package structure comprising a flexible substrate, a semiconductor device for driving the panel mounted on the flexible substrate, and input electrodes and output electrodes for the semiconductor device; and a circuit board provided with connection electrodes for supplying so as to leave an opening thereof and supplying a power and control signals to the semiconductor device; said process comprising the steps of:

(a) electrically connecting electrode terminals of the optical modulation panel to the output electrodes of the tape carrier package structure, (b) aligning the input electrodes of the tape carrier package structure with the connection electrodes of the circuit board, and (c) electrically connecting the input electrodes to the connection electrodes by a heat-pressure bonding while supplying a cooling gas toward the circuit board via the flexible substrate.

The present invention also provided a connection apparatus for electrically connecting first electrodes formed on a first substrate to second electrodes formed on a second substrate, comprising:

means for aligning the first electrodes of the first substrate with the second electrodes of the second substrate, means for effecting a heat-pressure bonding of the first and second electrodes, and means for cooling at least one of the first and second substrates.

The present invention further provided a mounting apparatus for electrically connecting electrodes formed on a flexible substrate and connected to a semiconductor device mounted on the flexible film to connection electrodes formed on a circuit board for supplying a power and control signals to the semiconductor device; the flexible substrate, the semiconductor device and the electrodes of the flexible substrate constituting a tape carrier package structure; said apparatus comprising:

means for aligning the electrodes of the flexible substrate with the connection electrodes of the circuit board, means for effecting a heat-pressure bonding of the electrodes and the connection electrodes, and means for cooling the circuit board via the flexible substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Hereinbelow, some preferred embodiments of of an electrode connection structure and the electrode connection method according to the present invention will be explained with reference to the drawings.

Figure 1:
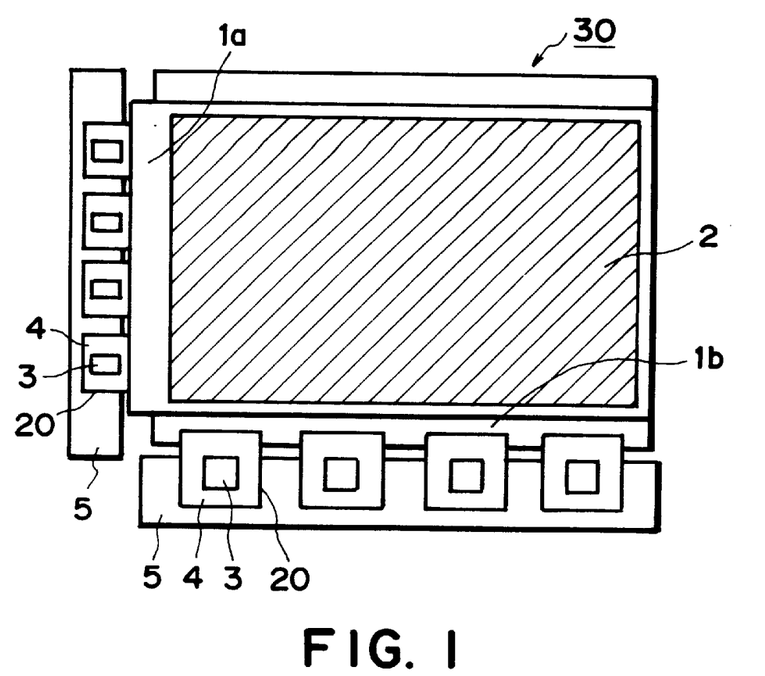
FIG. 1 is a schematic plan view of a liquid crystal display apparatus including a TCP provided with a driver IC and a PCB board electrically connected by the electrode connection method according to the present invention.
Figure 2:
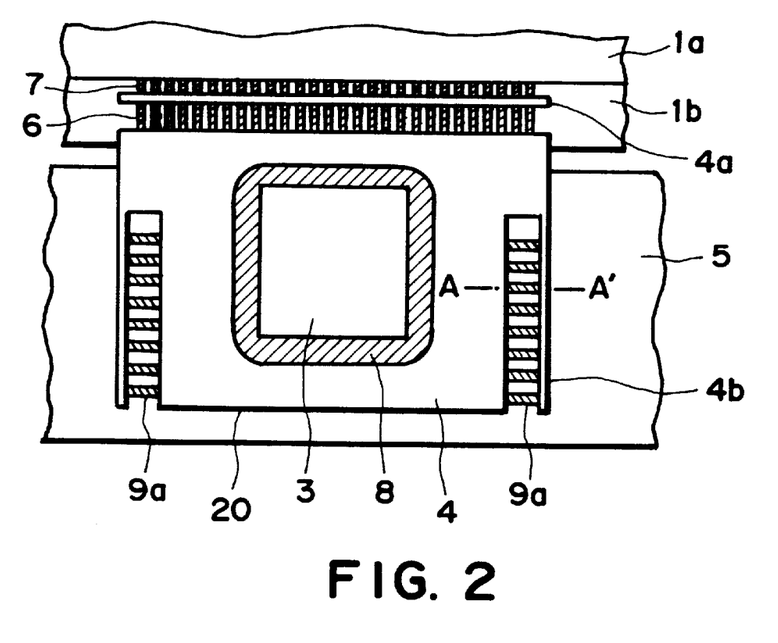
FIG. 2 is an enlarged partial view showing the connection structure of the TCP and the PCB board shown in FIG. 1.
Figure 3:
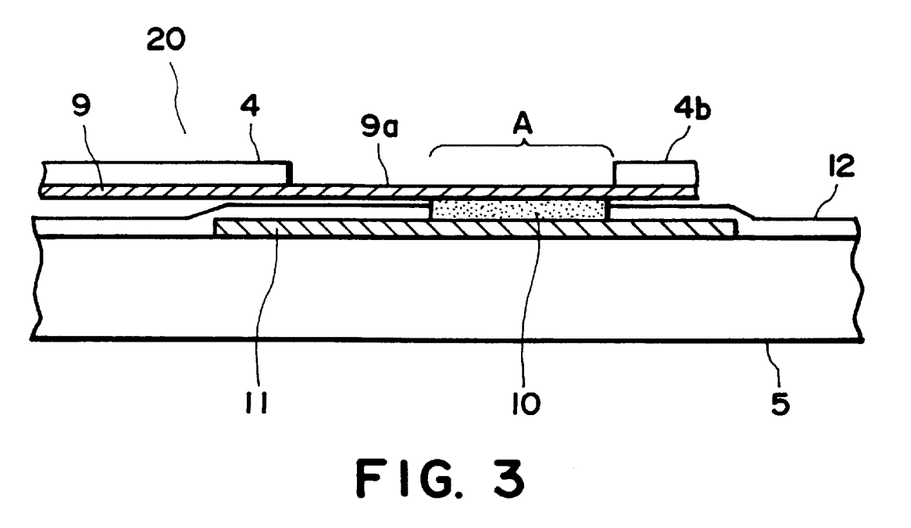
FIG. 3 is a schematic sectional view taken along an A–A' line in FIG. 2.

FIG. 1 is a schematic plan view of a liquid crystal display apparatus including a TCP bonded to a PCB board connected by the electrode connection method according to the present invention, FIG. 2 is a partial enlarged view of a part of the connection structure of the TCP (provided with a driver IC) and the PCB board shown in FIG. 1, and FIG. 3 is a sectional view of the connection structure taken along an A-A' line shown in FIG. 2.

Referring to FIG. 1, a liquid crystal display apparatus 30 includes a pair of oppositely disposed substrates (e.g., glass substrates) each provided with transparent electrodes (not shown) and an alignment film (not shown) and applied to each other with a prescribed cell gap via, e.g., a spacer member (spacer beads) (not shown). Into the cell gap, a liquid crystal material (not shown) is filled and a periphery of the cell is sealed up with a sealing member (not shown) to form a liquid crystal cell (panel). The electrodes of the respective substrates 1a and 1b are formed in a stripe shape and intersect with each other at, e.g., right angles to provide pixels at each intersection thereof, thus constituting, e.g., a simple matrix electrode structure. Outside the respective substrates 1a and 1b, a pair of polarizers 2 are disposed and bonded to the associated substrates, respectively.

To the transparent electrodes of the substrates 1a and 1b, TCPs 20 each including a semiconductor chip 3 (e.g., driver IC) for driving the liquid crystal panel mounted on a flexible film substrate 4 by the TAB method are electrically connected at their terminal portions (through electrode terminals). Each of the TCPs 20 is further electrically connected to a PCB board 5 (or peripheral circuit board) for inputting (supplying), e.g., a driving power and control signals to the associated semiconductor chip 3. The PCB substrates 5 are located along one edge of the substrates 1a and 1b, respectively, as shown in FIG. 1.

As shown in FIG. 2, the TCP 20 includes the semiconductor chip 3 formed on one side of the TCP by, e.g., the TAB method and includes an input electrode pattern (not shown) and an output electrode pattern (not shown) with respect to the semiconductor chip 3, respectively, formed on the other side of the TCP. These (input and output) electrode patterns are connected to the associated electrodes of the semiconductor chip 3. The periphery of the semiconductor chip 3 is coated with a resinous film 8. The flexible film substrate 4 of the TCP 20 is patterned so as to leave end portions 4b and 4a, thus providing openings (exposed portions) of the input and output electrode patterns with input lead electrodes 9a and output lead electrodes 6, respectively. The flexible film substrate may generally be made of a film of, e.g., polyimide or polyethylene terephthalate (PET).

Each of the input electrode pattern (input electrodes) and the output electrode pattern (output electrodes) may generally be formed at a prescribed pitch depending on the specification of the semiconductor chip 3 used. For instance, when the semiconductor chip 3 is employed as a driver IC for use in an ordinary liquid crystal display apparatus, each driver IC may have ca. 30–60 input electrodes arranged at a pitch of ca. 100–500 $\mu$m in both cases of constituting a data signal side IC and a scanning signal side IC. Further, the driver IC may have ca. 200–500 output electrodes arranged at a pitch of ca. 20–60 $\mu$m when used as a data signal side IC and at a pitch of ca. 100–300 $\mu$m when used as a scanning signal side IC.

The lead electrodes 6 of the output electrodes on the flexible film substrate 4 are connected to associated connection (terminal) electrodes 7 of the transparent electrodes of the substrate 1b (or 1a) as shown in FIG. 2. More specifically, at the end portion 4a of the flexible film substrate 4, the output lead electrodes 6 are registered or located in alignment with the corresponding connection electrodes 7 of the transparent electrode (on the substrate 1b) and heat-pressure bonded to each other with an anisotropic conductive (adhesive) film (ACF) to effect electrical connection.

The input electrodes 9, as shown in FIG. 3, are electrically connected to associated connection electrodes 11 partially pre-coated with a solder 10 (e.g., having a melting point of ca. 240° C.) at the exposed lead electrodes 9a by soldering. More specifically, each lead electrode 9a is connected via the solder 10 to a part of the associated connection electrode 9 in an end region A (right-hand side in FIG. 3) of the opening of the flexible film substrate 4 (the spacing between the substrate 4 and the end portion 4a of the substrate 4). Further, on the connection electrodes 11, a solder resist 12 is coated so as to leave (expose) an opening portion corresponding to the end region A, thus allowing an electrical connection thereat between the connection electrodes 11 of the PCB board 5 and the input lead electrodes 9a of the flexible input lead electrodes 9a of the flexible film substrate 4 through the solder 10.

The solder resist 12 is principally formed for protecting the (connection) electrodes of the PCB board 5 and may generally comprises an inorganic solder resist material or an organic solder resist material having resistances to heat and chemicals. Examples of the inorganic solder resist material may include a slurry of graphite powder or magnesium oxide powder. Examples of the organic solder resist material may include those comprising a thermosetting resin, such as melamine resin or epoxy resin, and a ultraviolet (UV)-curable resin.

Hereinbelow, the method of electrically connecting the input electrodes 9 formed on the flexible film substrate 4 of the TCP 20 and the connection electrodes 11 formed on the PCB board will be described more specifically with reference to FIGS. 3–5.

First, the positional relationship between the input electrodes 9 formed on the flexible film substrate 4 and the connection electrodes 11 formed on the PCB board 5 is shown in FIG. 3 as described above.

Figure 4A:
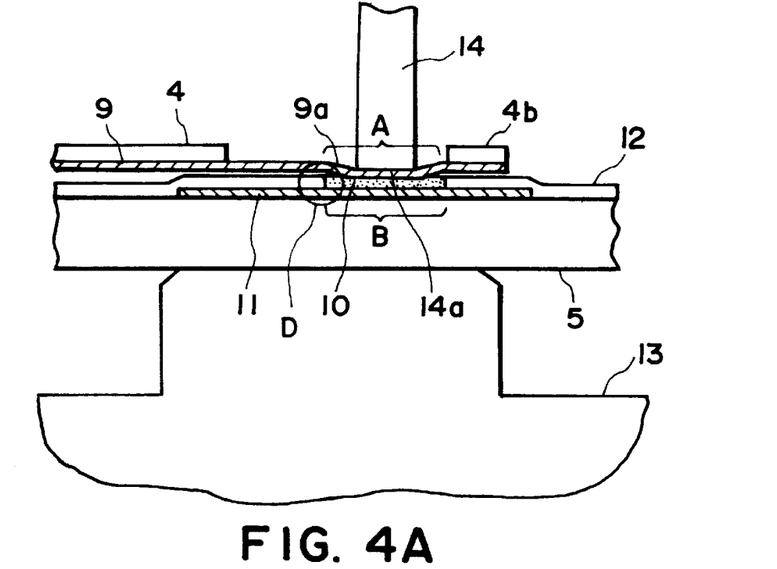
FIGS. 4A and 5 are respectively a schematic sectional view for illustrating an embodiment of a method of connecting input electrodes of a TCP to electrodes of a PCB board by heat-pressure bonding according to the present invention.
Figure 4B:
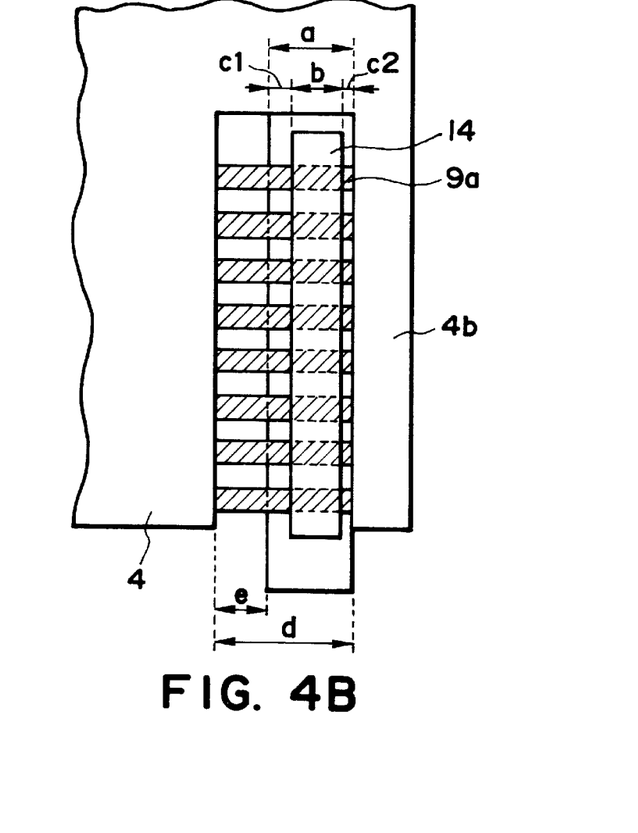
FIG. 4B is a schematic plan view corresponding to the sectional view of FIG. 4A.
Figure 5:
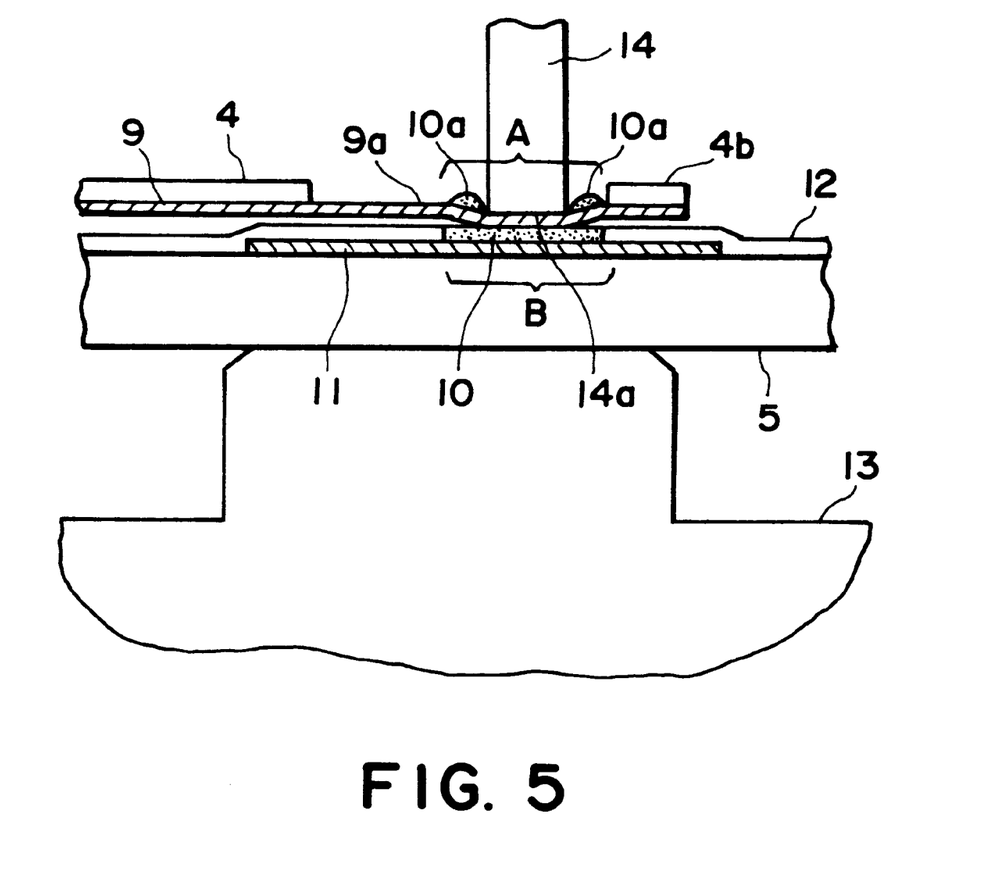

More specifically, the lead portion 9a of the input electrodes 9 of the flexible film substrate 4 are located at the opening, between the substrate members 4 and 4b, including the end region A (shown in FIGS. 3–5). The connection electrodes 11 of the PCB board 5 are coated with the solder resist 12 so as to expose a part (opening portion) of the connection (this part corresponds to an opening portion B shown in FIGS. 4A and 5) and also pre-coated with the solder 10 at the opening portion corresponding to the end region A.

Then, a flux is applied onto the pre-coated solder 10 on the connection electrodes 11 of the PCB board 5, and a positional alignment is effected so that the portion (at the end region A) of the input lead electrodes 9a of the flexible film substrate 4 is aligned with the opening portion B (where the solder resist 12 is not coated) at the connection electrode 11 of the PCB board 5 provided with the pre-coated solder 10.

In the thus-aligned state, as shown in FIG. 4A, on the PCB board 5 placed on a stage 13, the superposed electrode structure sandwiching the solder 10 is heat-pressed only in the end region A (in alignment with the opening portion B) via a heat-pressure bonding head 14 heated at 200–300° C.

thus electrically connecting the input lead electrodes 9a and the associated connection electrodes 11, respectively, by soldering. At the time of heat-pressure bonding, the heat-pressure bonding head 14 has a tip face 14a having a tip width (in a longitudinal direction (elongation direction) of the input lead electrodes 9a) smaller or narrower than the width of the opening portion B (in the same direction), whereby, only in the end region A, the entire region of the tip face 14a of the heat-pressure bonding lead 14 presses the superposed electrode structure (the input lead electrodes 9a, the solder 10 and the connection electrode 11) against the PCB board 5 placed on the stage 13, thereby fixedly connecting the electrodes 9a and 10 via the solder 10.

FIG. 4B is a top view illustrating a positional relationship between the heat-pressure bonding head 14 and the input lead electrodes 9a at the time of the electrical connection operation shown in FIG. 4A. Referring to FIG. 4B, the input lead electrodes 9a are bonded to the associated connection electrodes aligned with the input lead electrodes 9a, respectively, via the solder at a connection region having a width b corresponding to that of the tip face of the heat-pressure bonding head 14 in the opening of the solder resist (of the PCB board) having a width a.

More specifically, as shown in FIGS. 4A and 4B, the width b of the tip face 14a of the heat-pressure bonding head 14 is set to be narrower (smaller) than the width a (B in FIG. 4A) so as to leave an inner region having a width C1 (closer to the inner portion of the flexible film substrate 4 connected to the semiconductor chip) and an outer region having a width C2 closer to the end portion 4b of the substrate 4 in the longitudinal direction of each input lead electrode 9a. In FIG. 4B, a region of the input lead electrodes 9a having a width e is not subjected to the heat-pressure bonding operation at all. At the time of the heat-pressure bonding between the input lead electrodes 9a and the connection electrodes 11 via the pre-coated solder 10, an excessive solder can escape from the inner and outer regions (having the widths C1 and C2, respectively), if any.

The above heat-pressure bonding operation only in the end region A, exactly the connection region having the width b in FIG. 4B, by using the narrower heat-pressure bonding head 14 is also effective in preventing an occurrence of a solder bridge between, e.g., adjacent input electrodes 9a even when an excessive amount of the solder 10 is pre-coated on the connection electrodes 11 at the opening portion B of the solder resist 12 as shown in FIG. 5 since the excessive solder 10a in a melted state is allowed to flow out or escape equally from both outer sides (the inner and outer regions C1 and C2 in FIG. 4B) of the heat-pressure bonding head 14 at the opening portion B corresponding to the end region A.

On the other hand, even when a small amount of the solder 10 is pre-coated, the above heat-pressure bonding operation only in the end region A ensures a stable thermo-compression bonding of the electrodes 9a and 11 through the solder 10 irrespective of the thickness of the solder resist layer 12 since the heat-pressure bonding head 14 is pressed only at the connection region b shown in FIG. 4B.

In the electrical connection operation between the input lead electrodes 9a and the connection electrodes 11 shown in FIGS. 4A and 4B, the width of the solder resist 12 (B in FIG. 4A and a in FIG. 4B) may appropriately be determined depending on structures of electronic elements, such as the circuit board and the semiconductor device the widths of the heat-pressure bonding head and the input and connection electrodes, and an amount of the pre-coated solder. In a preferred embodiment of the present invention, as shown in FIG. 4B, the width a of the opening portion B (in FIG. 4A) is set to be wider than the width b of the heat-pressure bonding head 14 and more preferably be set to 0.5–2.0 mm. Further, the ratio of b/a may preferably be 0.5–0.9. At this time, the width C1 of the inner portion of the input lead electrodes 9a and the width of the outer portion thereof described above may preferably be set to 0.1–0.3 mm, respectively. Further, the widths C1 and C2 may more preferably be set to satisfy the relationship: C1>C2, whereby a pressure exerted on a region D shown in FIG. 4A can effectively be alleviated to prevent, e.g., a breakage thereat.

The exposed input lead electrodes 9a on the flexible film substrate 4, as shown in FIGS. 4A and 4B, may preferably be electrically connected to the associated connection electrodes 11 formed on the PCB board 5 in the opening portion a of the solder resist 12 in an entire exposed region having a width d while leaving the region having the width e as described above. This is because the region e not subjected to the electrical connection functions as a buffer region for suppressing deformation or distortion of the input lead electrodes 9a and the flexible film substrate 4. In view of this function, the width e may preferably be set to have a minimum value satisfying $e \geq d/5$, more preferably $e \geq d/4$, and a maximum value satisfying $e \leq d/2$, more preferably $e \leq 2d/5$.

Further, when the electrical connection is performed in the end region (the opening region a in FIG. 4B) of the input lead electrodes 9a, the relationship C1>C2 described above may preferably be adopted since the inner region C1 and the outer region C2 each contacting the connection region b are also effective in escaping the excessive solder 10a therefrom as shown in FIG. 5.

In a specific example, in accordance with the heat-pressure bonding operation illustrated in FIGS. 4A and 4B, input lead electrodes 9a, each having a width of 0.2 mm and a lead length of 2.0 mm (e in FIG. 4B) arranged at a pitch of 0.5 mm, of a flexible film substrate 4 (of a TCP 20 as shown in FIG. 3) were bonded via a solder 10 to connection electrodes 11, each having a width of 0.25 mm arranged at a pitch of 0.5 mm, of a PCB board 5 in an opening region B of a solder resist 12 (a region a in FIG. 4B) set to 1.2 mm by using a heat-pressure bonding head 14 having a tip face 14a having a width of 0.8 mm for 2 seconds at 240° C. under application of a force of about 5–10 N/mm$^2$ per unit area of the inner lead electrode 9a and the connection electrode 11. As a result, all the input lead electrodes 9a and the connection electrodes 11 were well electrically connected via the solder 10 with high accuracy without causing a problematic excessive solder bridge.

In the above-described embodiment, the electrode connection method via the solder according to the present invention is applied to the electrode connection structure between the flexible film substrate 4 of the TCP 20 and the PCB board in the liquid crystal display apparatus but may also be widely applied to other electrode connection structures including one substrate provided with an electrode pattern and the other substrate provided with an electrode pattern coated with a resist material with an opening where the electrode pattern is exposed in various electronic equipments, such as flat displays.

In recent years, a display apparatus, such as a liquid crystal display apparatus has been required to have a higher resolution and a larger size, thus resulting in a smaller connection pitch for connection between the output electrodes of the TCPs provide each with a driver IC and the electrode terminals on the substrate of a display panel year by year. Further, the number of the TCPs packaged has increased and correspondingly a peripheral circuit board (PCB board) has been modified to have a large size and an elongated shape.

For this reason, particularly in a mounting (surface mounting) apparatus for electrically connecting electrodes of the TCP including a flexible film substrate and electrodes of the PCB board comprising, e.g., glass-epoxy resin board, a plurality of input electrodes of the TCPs are simultaneously heat-pressure bonded to associated electrodes of the PCB board by using a plurality of heat-pressure bonding head or an elongated (heat-pressure bonding) head in order to reduce a production time.

However, in the case where the heat-pressure bonding of plural input electrodes of the TCPs is performed at the same time by using the mounting apparatus, the PCB board is liable to increase an amount of thermal expansion due to the heat-pressure bonding. If such a thermal expansion amount of the PCB board is excessively increased, the shearing force occurring in the TCP along the side of the substrate of the display panel where the TCP and the PCB are oppositely disposed, whereby the input electrodes of the TCP fixedly connected to the connection electrodes of the PCB is liable to cause a breakage thereof, thus resulting in conduction failure. Further, a breakage of a connection between a driver IC (semiconductor chip) mounted on the TCP and input and output electrode patterns (inner leads) or a peeling of a bonded portion between the output electrodes of the TCP and the substrate of the display panel can also be caused, thus leading to connection failure in some cases. Further, it is particularly important to solve the above problems in. the case of an elongated PCB board having a length of above 10 inches.

In view of the above circumstances, in the present invention, when the TCP provided with the electrode patterns for inputting and outputting signals to a semiconductor device (as the driver IC) mounted on the flexible film substrate is connected to or mounted on the PCB board, the electrode patterns of the TCP and the electrodes of the PCB board may preferably be connected by the heat-pressure (thermo-compression) bonding while cooling the PCB board from the TCP side. Particularly, at the time of mounting the TCPs each provided with the semiconductor device (driver IC) for supplying driving signals to a optical modulation panel (e.g., display panel) in production of optical modulation apparatus (e.g., display apparatus), a connection between the input electrode patterns of the TCPs and the connection electrodes of the PCB board for supplying control signals and a driving power to the driver IC mounted on the TCP may preferably be performed by the heat-pressure bonding while cooling the PCB board via the TCP in the vicinity of the heat-pressure bonding region.

Figure 8:
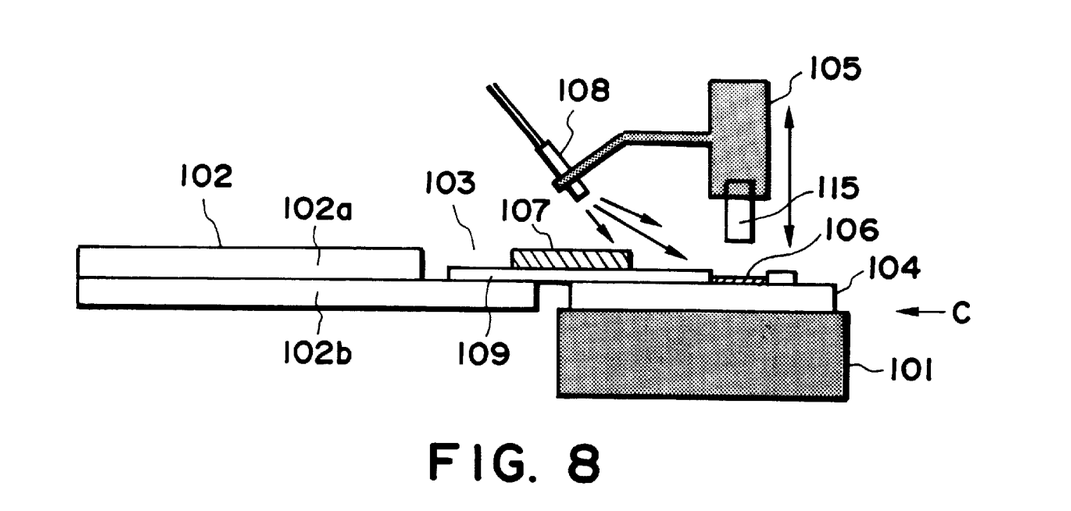
FIG. 8 is a schematic sectional view for illustrating another embodiment of an electrode connection method employing a cooling means according to the present invention.

FIG. 8 is a schematic sectional view illustrating an embodiment of the cooling operation as described above adopted in a mounting apparatus for mounting or connecting a TCP provided with a driver IC for driving a display panel of a liquid crystal apparatus.

Referring to FIG. 8, on a pressing stage 101, a PCB board 104 provided with a connecting electrode pattern (not shown) is set at a prescribed position. The PCB board 104 supplies input signals and power signals to a TCP 103 provided with an input lead electrode pattern 106 located so as to be in alignment with the connecting electrode pattern of the PCB board 104 by a positional alignment means (not shown). The TCP 103 is mounted on a display panel 102 including a pair of substrates 102a and 102b. A heat-pressure bonding unit 105 provided with a heat-pressure bonding head 115 (heat-pressure bonding means) for electrically connecting the input lead electrode pattern 106 of the TCP 103 with the connecting electrode pattern of the PCB board 104 are located over the input lead electrode pattern 106. The heat-pressure bonding unit 105 is movable in a direction of an arrow (upward and downward) and provided with a cooling means having a cooing nozzle 108. The TCP 103 includes a flexible film substrate 109 and a driver IC 107 mounted on the flexible film substrate 109 by the TAB method.

After the alignment of the input electrode pattern 106 with the corresponding connecting electrode pattern, these electrode patterns are heat-pressured bonded to each other by pressing the patterns against the PCB board 104 with the heat-pressure bonding head 115 while cooling the PCB board by cooling air blow supplied from the cooling nozzle 108, thus effecting an electrical connection between the input electrode pattern 106 of the TCP 103 an the connecting electrode pattern of the PCB board 104.

Figure 9:
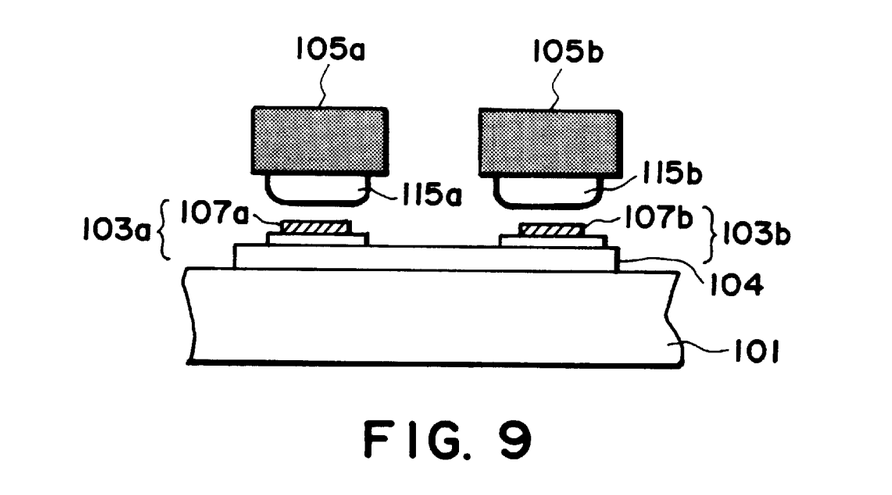
FIG. 9 is a schematic sectional view viewed from a position C shown in FIG. 8.

FIG. 9 is a schematic sectional view for illustrating a positional relationship between the above heat-pressure bonding unit 105 and the TCP 103 when viewed from the position C in FIG. 8.

Referring to FIG. 9, a plurality of heat-pressure bonding units 105a and 105b provided with heat-pressure bonding heads 115a and 115b, respectively. Behind each heat-pressure bonding unit (105a, 105b), a cooling means provided with a cooling nozzle (not shown) is disposed. The heat-pressure bonding is performed under the above positional conditions, whereby the plural heat-pressure units (105a and 105b) are actuated at the same time, thus effectively mounting a plurality of TCPs 103a and 103b provided with driver ICs 107a and 107b, respectively, on one PCB board 104 at the same time while ensuring electrical connection therebetween.

Figure 10:
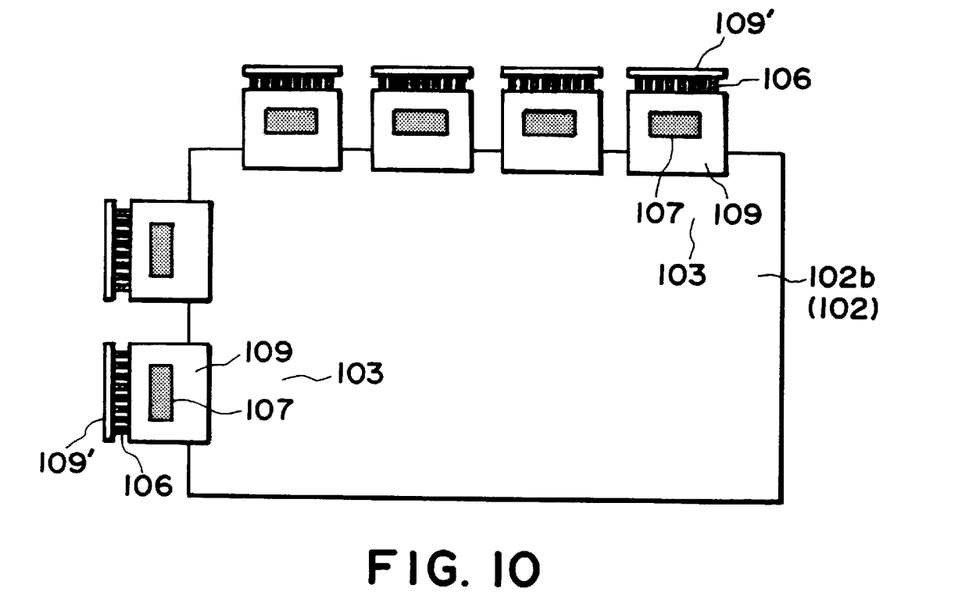
FIG. 10 is a schematic plan view showing an embodiment of a liquid crystal panel provided with a TCP connected to a PCB board according to the method of the present invention illustrated in FIG. 8.

FIG. 10 is a schematic plan (top) view of an embodiment of a display panel provided with the TCPs mounted in the manner shown in FIGS. 8 and 9 described above.

Referring to FIG. 10, the display panel 102 include the substrate 102b is connected with plural TCPs 103 each comprising a flexible film substrate 109 and a driver IC 107 mounted thereon at two side portions of the substrate 102b. At the side portions, each TCP 103 is connected to the substrate 102b via, e.g., an anisotropic conductive film (ACF). More specifically, output lead electrodes (not shown) of each TCP 3 are electrically connected with associated electrode terminals (not shown) formed on the substrate 2b through the ACF. The flexible film substrate 109 is formed in a prescribed pattern to leave an end portion 109' with an opening (spacing) between the substrate 109 and the portion 109'. At the opening, a plurality of input lead electrodes 106 are exposed.

Figure 11:
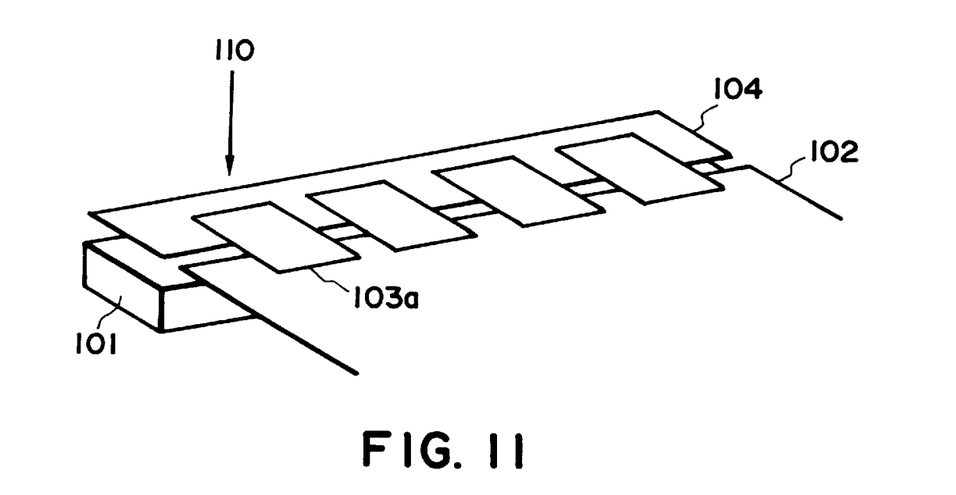
FIG. 11 is a schematic view for illustrating an operation of heat-pressure bonding according to the method shown in FIG. 8.

FIG. 11 is a schematic view for illustrating an operation for setting a display panel provided with plural TCPs together with a PCB board so as to provide the state shown in FIG. 8.

Referring to FIG. 11, for example, within respect to the pressing stage 101, the display panel 102 provided with TCPs including the TCP 103a and/or the PCB board 104 (or the pressing stage 101 thereunder) are moved, a desired, so as to align the input lead electrodes (106 in FIG. 8) of the TCP 103a with the connection electrodes of the PCB board with accuracy. In this instance, a solder is pre-coated onto the connecting surface of the connecting electrode pattern (connection electrodes). Then, on the pressing stage 101, the heat-pressure boding head (115 in FIG. 8, 115*a* ad 115*b* in FIG. 9) of the heat-pressure bonding unit (105 in FIG. 8, 105*a* and 105*b* in FIG. 9) is moved down to the connection portion in a direction of an arrow 110, thereby heat-pressure bonding the input lead electrodes (of the TCP 103*a*) to the connection electrodes (of the PCB board 104) though the melted solder pre-coated on the connection electrodes, thus effecting an electrical connection of the electrodes.

In this embodiment, the above electrical connection operation is performed for every TCP but may be performed simultaneously with respect to prescribed plural TCPs (two TCPs as in the embodiment shown in FIG. 9). After the single electrical connection operation is completed, a subsequent electrical connection operation with respect to other plural TCPs is performed simultaneously in a state such that other input level electrodes are aligned with corresponding connection electrodes by moving the pressing stage 101 and/or the liquid crystal panel 102.

In the above embodiment shown in FIG. 11, the PCB board is cooled by a cooling means provided with a cooling nozzle (108 shown in FIG. 8) connected with the heat-pressure bonding unit (105 in FIG. 8), e.g., via the objective TCP(s) at the time of the heat-pressure bonding operation as described above.

More specifically, in the state shown in FIG. 8 or FIG. 11, the input lead electrodes 106 of the TCP 103 (103*a*) and the connection electrodes (not shown) of the PCB board 104 are aligned with each other. Thereafter, the cooling nozzle 108 is moved down toward the objective TCP while accompanying the heat-pressure bonding head 115 of the heat-pressure bonding unit 105 moved down to the connection portion and supplies a cooling gas toward a prescribed region including the connection portion, thus cooling the PCB board 104 through the TCP 13 at least at the time of the heat-pressure bonding operation.

As a result, the thermal expansion of the PCB board during the heat-pressure bonding between the input lead electrodes and the connection electrodes can be immediately settled or suppressed, so that it becomes possible to obviate difficulties, such as a breakage of a connection between the input electrodes of the TCP and the connection electrodes of the PCB board, a breakage or damage of a connection between the semiconductor device (driver IC) mounted on the TCP and the input electrodes or the output electrodes, and a breakage or damage of a connection between the output electrodes of the TCP and the electrode terminals (connection electrodes) of the substrate of the display panel, without producing a shearing force (shearing stress) to the TCP along a side of the substrate of the display panel along which the TCP and the PCB board on which the TCP is mounted are arranged.

Accordingly, the above-described heat-pressure bonding operation between the electrodes of the TCP and those of the PCB board can effectively be performed successively without causing an occurrence of the connection failure due to the thermal expansion of the PCB board.

In the cooling step of the heat-pressure bonding operation, the cooling gas used therefor may include nitrogen gas ($N_2$) and dry air from which fine dust particles are removed by, e.g., a filter. The cooling gas may preferably be supplied to the objective substrate at a pressure of about 8–9 kg/cm$^2$, a flow rate of 5–20 l/min., and a temperature of ca. 10–20° C.

Figure 12:
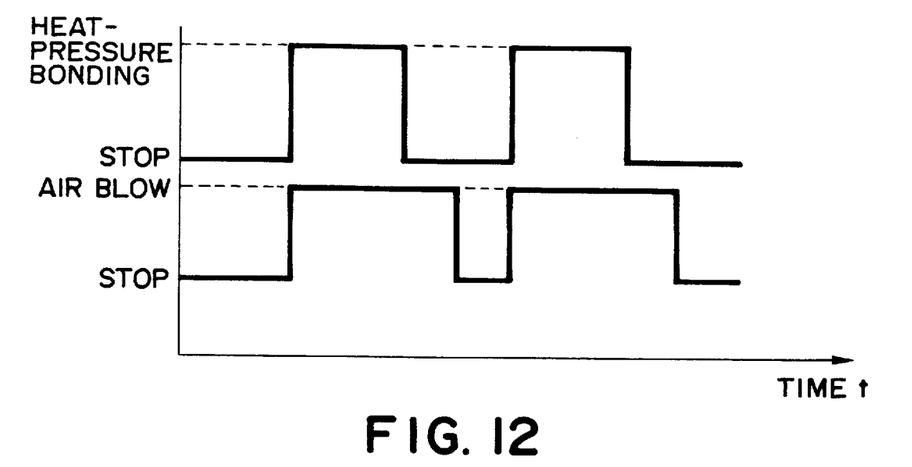
FIGS. 12 and 13 are respectively a time chart showing a relationship between an air blow operation and a heat-pressure bonding operation.

In the cooling step of the heat-pressure bonding of the plural TCPs, the air (cooling gas) blow operation though the cooing nozzle of the cooling means may preferably be performed in synchronism with the heat-pressure bonding operation at a timing as shown in FIG. 12. More specifically, as shown in FIG. 12, the air blow operation is initiated together with the start of the heat-pressure operation and retained for a prescribed period after the stop of the heat-pressure operation.

Figure 13:
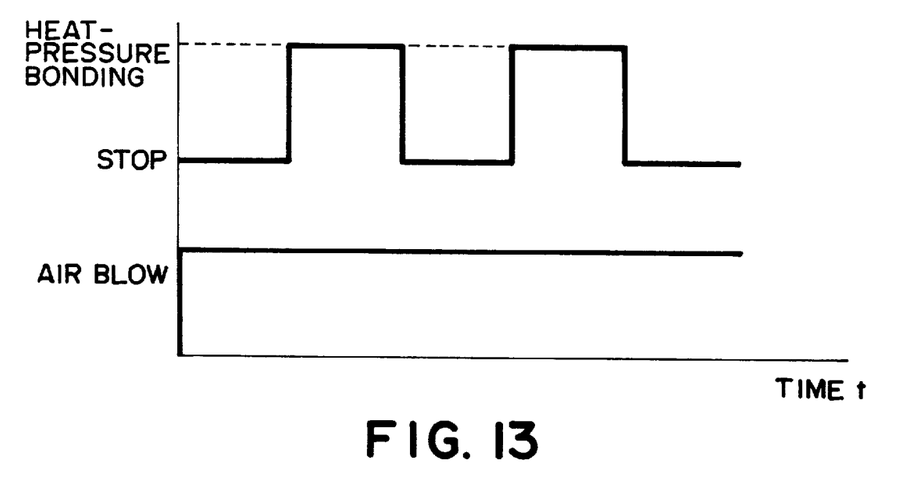

In the present invention, the air blow operation may be continuously performed irrespective of the period of the heat-pressure bonding operation as shown in FIG. 13. In this case, the thermal expansion of the PCB board due to the heat-pressure operation can more quickly be attenuated.

The cooling means (e.g., having the cooling nozzle 108 in FIG. 8) may preferably be provided to each heat-pressure bonding unit in the case of using the plurality of the heat-pressure bonding unit 105*a* and 106*b* as shown in FIG. 9. The number of the cooling means, however, may appropriately be determined with respect to the number of the heat-pressure bonding units depending on, e.g., the number of the TCPs mounted on the PCB board, and the size and material of the PCB board.

The above-described heat-pressure bonding operation using the cooling means as shown in FIGS. 8–13 may preferably be applied to the electrode connection method as described with reference to FIGS. 4A, 4B and 5 wherein the heat-pressure bonding head and the connection portion provide a particular positional relationship. As a result, the electrodes of the TCP and those of the PCB board are more effectively be connected with high accuracy by the additional cooling operation.

Further, the above-described cooling operation may be applied to not only the heat-pressure bonding of the different electrodes with the solder but also the bonding with the ACF.

What is claimed is:

1. An optical modulation apparatus comprising:
   a display panel having a plurality of display electrodes;
   a printed circuit board disposed along a side of the display panel and having thereon a plurality of first electrodes; and
   a plurality of flexible film substrates arranged along the side of the display panel, wherein each flexible film substrate has:
   a semiconductor chip mounted thereon,
   a first opening along the side of the display panel and second and third openings at mutually opposite positions with respect to the semiconductor chip, and
   second electrodes functioning as output electrodes of the semiconductor chip and connected to the display electrodes of the display panel at the first opening, and third and fourth electrodes functioning as input electrodes of the semiconductor chip and connected to the first electrodes of the printed circuit board at the second and third openings, respectively.

2. An apparatus according to claim 1, wherein said semiconductor chip supplies output drive signals to the display panel based on input signals supplied from the printed circuit board.

3. An apparatus according to claim 1, wherein said printed circuit board comprises a glass-epoxy resin board.

4. An apparatus according to claim 1, wherein the printed circuit board is locally coated with a resist pattern having an opening through which the third or fourth electrodes of the flexible film substrate and the first electrodes of the printed circuit board are connected with each other at the second or third opening of the flexible film substrate.

5. An apparatus according to claim 4, wherein said resist pattern comprises a thermosetting resin.

6. An apparatus according to claim 4, wherein said resist pattern comprises an ultraviolet-curable resin.

7. An apparatus according to claim 4, wherein the third or fourth electrodes of the flexible film substrate and the first electrodes of the printed circuit board both extend in a first direction and are aligned with each other, and the opening of the resist pattern is elongated in a direction perpendicular to said first direction.

* * * * *

UNITED STATES PATENT AND TRADEMARK OFFICE
CERTIFICATE OF CORRECTION

PATENT NO. : 6,320,691 B1
DATED : November 20, 2001
INVENTOR(S) : Toshimichi Ouchi et al.

It is certified that error appears in the above-identified patent and that said Letters Patent is hereby corrected as shown below:

Column 1,
Line 39, "herein after" should read -- hereinafter --;
Line 40, "to" should read -- to as --; and
Line 67, "is" should read -- are --.

Column 2,
Line 25, "made" should read -- made to --;
Line 48, "An" should read -- A --; and
Line 52, "substrate." should read -- substrates. --.

Column 6,
Line 28, "comprises" should read -- comprise --;
Line 34, "a" should read -- an --;
Line 46, "are" should read -- is --; and
Line 67, "200-300° C." should read -- 200-300° C., --.

Column 8,
Line 67, "TCPs" should read -- TCPs to --.

Column 9,
Line 13, "head" should read -- heads --;
Line 24, "is" should read -- are --;
Line 32, "in." should read -- in --; and
Line 45, "a" should read -- an --.

Column 10,
Line 9, "cooing" should read -- cooling --;
Line 15, "heat-pressured" should read -- heat-pressure --;
Line 20, "an" should read -- and --;
Line 41, "include" should read -- including --;
Line 60, "within" should read -- with --; and
Line 63, "a" should read -- as --.

UNITED STATES PATENT AND TRADEMARK OFFICE
CERTIFICATE OF CORRECTION

PATENT NO. : 6,320,691 B1
DATED : November 20, 2001
INVENTOR(S) : Toshimichi Ouchi et al.

It is certified that error appears in the above-identified patent and that said Letters Patent is hereby corrected as shown below:

Column 11,
Line 2, "boding" should read -- bonding --.

Column 12,
Line 15, "unit" should read -- units --; and
Line 28, "be" should be deleted.

Signed and Sealed this

Thirtieth Day of April, 2002

Attest:

Attesting Officer

JAMES E. ROGAN
*Director of the United States Patent and Trademark Office*